(12) United States Patent
Kim et al.

(10) Patent No.: US 11,887,883 B2
(45) Date of Patent: Jan. 30, 2024

(54) HETEROGENEOUS COMPOSITE MATERIAL AND METHOD FOR PRODUCING THE SAME

(71) Applicant: SEMES CO., LTD., Chungcheongnam-do (KR)

(72) Inventors: Do Yeon Kim, Gyeonggi-do (KR); Pil Kyun Heo, Gyeonggi-do (KR); Ho Jong Hwang, Gyeonggi-do (KR); Hyun Yoon, Gyeonggi-do (KR); Jong Min Lee, Gyeonggi-do (KR); Chul Gyun Baik, Gyeonggi-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 206 days.

(21) Appl. No.: 17/341,696

(22) Filed: Jun. 8, 2021

(65) Prior Publication Data
US 2021/0384064 A1    Dec. 9, 2021

(30) Foreign Application Priority Data
Jun. 9, 2020    (KR) .......... 10-2020-0069778

(51) Int. Cl.
*B32B 3/00*    (2006.01)
*H01L 21/687*    (2006.01)
(Continued)

(52) U.S. Cl.
CPC .... *H01L 21/68757* (2013.01); *B29C 45/0001* (2013.01); *B29C 45/0055* (2013.01);
(Continued)

(58) Field of Classification Search
CPC ..... B29C 43/00; B29C 43/003; B29C 43/006; B29C 43/18; B29C 43/203
See application file for complete search history.

(56) References Cited

U.S. PATENT DOCUMENTS

| | | | |
|---|---|---|---|
| 5,670,189 A | * | 9/1997 | Dalton .................... B29C 43/44 425/371 |
| 9,586,347 B2 | | 3/2017 | Mancini |

(Continued)

FOREIGN PATENT DOCUMENTS

| | | |
|---|---|---|
| JP | 2019531930 A | 11/2019 |
| KR | 20140130141 A | 11/2014 |

OTHER PUBLICATIONS

Korean Notification of Reason for Refusal for Korean Application No. 10-2020-0069778, dated Apr. 22, 2022 with 1 translation, 7 pages.

(Continued)

*Primary Examiner* — Elizabeth E Mulvaney
(74) *Attorney, Agent, or Firm* — RatnerPrestia

(57) ABSTRACT

A heterogeneous composite material and a method for manufacturing the heterogeneous composite material are provided. The heterogeneous composite material includes a first compression structure formed by compressing a first material, and a second compression structure formed by compressing a second material different from the first material, and disposed in close contact with the first compression structure, wherein at least a portion of the first compression structure and at least a portion of the second compression structure are disposed on both sides of a boundary surface existing in a circular shape with a predetermined radius with respect to a central axis in a state in contact with each other at the boundary surface.

19 Claims, 19 Drawing Sheets

(51) Int. Cl.
  *B29C 45/00*    (2006.01)
  *B29C 45/16*    (2006.01)
  *B29K 507/04*    (2006.01)
  *B29K 27/18*    (2006.01)

(52) U.S. Cl.
  CPC ........ *B29C 45/16* (2013.01); *H01L 21/68721*
    (2013.01); *B29K 2027/18* (2013.01); *B29K 2507/04* (2013.01)

(56) References Cited

OTHER PUBLICATIONS

U.S. PATENT DOCUMENTS

| | | | |
|---|---|---|---|
| 10,183,421 B2 | 1/2019 | Gordin et al. | |
| 2007/0044906 A1* | 3/2007 | Park | B32B 25/14 |
| | | | 264/471 |
| 2007/0224144 A1 | 9/2007 | Lazzarini et al. | |
| 2016/0215820 A1* | 7/2016 | Sugai | B22F 7/06 |

OTHER PUBLICATIONS

Korean Written Decision on Registration for Korean Application No. 10-2020-0069778, dated Sep. 8, 2022 with 1 translation, 6 pages.

* cited by examiner

HETEROGENEOUS COMPOSITE MATERIAL AND METHOD FOR PRODUCING THE SAME

CROSS REFERENCE TO RELATED APPLICATION

This application claims the benefit of Korean Patent Application No. 10-2020-0069778, filed on Jun. 9, 2020, in the Korean Intellectual Property Office, the disclosure of which is incorporated herein by reference in its entirety.

BACKGROUND OF THE INVENTION

1. Field

The present invention relates to a heterogeneous composite material generated to reduce the loss of material for manufacturing a semiconductor manufacturing equipment component and a method for manufacturing the heterogeneous composite material.

2. Description of the Related Art

In the semiconductor industry, fluoroplastics having properties such as chemical resistance, heat resistance, and abrasion resistance are used as materials for manufacturing components. Fluoroplastics refers to a resin containing fluorine in a molecule. Fluoroplastics include polytetrafluoroethylene (PTFE), polychlorotrifluoroethylene (PCTFE), and polyvinylidene fluoride (PVDF), and among them, polytetrafluoroethylene is mainly used in the semiconductor industry.

Particularly, in order to further improve chemical resistance and abrasion resistance, components may be manufactured by compression molding. In this case, CNT-PTFE manufactured by synthesizing carbon nanotubes and polytetrafluoroethylene may be used as a material.

SUMMARY OF THE INVENTION

The problem to be solved by the present invention is to provide a heterogeneous composite material in order to reduce the loss of materials for manufacturing a semiconductor manufacturing equipment component, and a method for manufacturing the heterogeneous composite material.

The problems of the present invention are not limited to the problems mentioned above, and other problems that are not mentioned will be clearly understood by those skilled in the art from the following description.

One aspect of the heterogeneous composite material of the present invention for achieving the above object comprises a first compression structure formed by compressing a first material, and a second compression structure formed by compressing a second material different from the first material, and disposed in close contact with the first compression structure, wherein at least a portion of the first compression structure and at least a portion of the second compression structure are disposed on both sides of a boundary surface that has a predetermined radius with respect to a central axis and exists in a circular shape in a state in contact with each other at the boundary surface.

Wherein the boundary surface comprises at least one of a parallel surface parallel to the central axis and an inclined surface formed inclined to the central axis.

Wherein the boundary surface includes a plurality of detailed boundary surfaces having different radii with respect to the central axis, wherein a first portion of the first compression structure and a first portion of the second compression structure are disposed on both sides of the first detailed boundary surface in a state in contact with each other at the first detailed boundary surface among the plurality of detailed boundary surfaces, wherein a second portion of the first compression structure and a second portion of the second compression structure are disposed on both sides of a second detailed boundary surface in a state in contact with each other at the second detailed boundary surface among the plurality of detailed boundary surfaces.

At least one of a mixed layer including a portion of the first compression structure and a portion of the second compression structure, and a single layer including only a portion of the first compression structure or a portion of the second compression structure is included.

Wherein the first compression structure and the second compression structure have different electrical conductivity.

Wherein the first compression structure includes a carbon nanotube-polytetrafluoroethylene (CNT-PTFE), wherein the second compression structure includes polytetrafluoroethylene (PTFE).

One aspect of the method for manufacturing a heterogeneous composite of the present invention for achieving the above object comprises installing a frame in a first cavity formed in a mold, injecting a first material into an outer space of the frame of the first cavity, removing the frame to form a second cavity including a boundary surface in contact with the first material, injecting a second material different from the first material into the second cavity, and simultaneously compressing the first material and the second material to generate a heterogeneous composite material, wherein the boundary surface exists in a circular shape with a predetermined radius with respect to a central axis of the frame, wherein at least a portion of the first material and at least a portion of the second material are disposed on both sides of the boundary surface in a state in contact with each other at the boundary surface.

Wherein the mold includes an opening corresponding to a plane of one side of the first cavity, wherein the first material and the second material are injected through the opening, wherein the frame is inserted into the first cavity or discharged from the first cavity through the opening.

Wherein the first material and the second material are injected into the mold in a form of powder.

Wherein at least one of a mixed layer including the first material and the second material, and a single layer including only the first material or the second material is disposed in the mold.

Wherein the first material and the second material are injected in a form of powder.

Wherein the first material and the second material have different electrical conductivity.

Wherein the first material includes carbon nanotube-polytetrafluoroethylene (CNT-PTFE), wherein the second material includes polytetrafluoroethylene (PTFE).

Wherein the frame includes a boundary side surface that forms the boundary surface, wherein the boundary side surface includes at least one of a parallel surface parallel to a central axis of the frame and an inclined surface formed inclined to a central axis of the frame.

Wherein the frame includes a plurality of auxiliary frames having boundary side surfaces of different radii with respect to the central axis of the frame, wherein a first portion of the first material and a first portion of the second material are disposed on both sides based on a first boundary surface formed by a boundary side surface of a first auxiliary frame among the plurality of auxiliary frames, wherein a second portion of the first material and a second portion of the second material are disposed on both sides based on a second boundary surface formed by a boundary side surface of a second auxiliary frame among the plurality of auxiliary frames.

Another aspect of the method for manufacturing a heterogeneous composite of the present invention for achieving the above object comprises installing a frame having a shape of a cylinder or a hollow cylinder in a first cavity formed in a mold and having a shape of a cylinder or a hollow cylinder, injecting a first material in a form of powder into an outer space of the frame of the first cavity, removing the frame to form a second cavity including a boundary surface in contact with the first material, injecting a second material in a form of powder different from the first material into the second cavity, and simultaneously compressing the first material and the second material to generate a heterogeneous composite material, wherein the mold includes an opening corresponding to a plane of one side of the first cavity, the first material and the second material are injected through the opening, and the frame is inserted into the first cavity or discharged from the first cavity through the opening, wherein the frame is installed in the first cavity in a state in which a central axis of a circular or ring-shaped cross-section of the frame coincides with a central axis of a circular or ring-shaped cross-section of the first cavity, wherein the boundary surface exists in a circular shape with a predetermined radius with respect to a central axis of a circular or ring-shaped cross section of the frame, wherein at least a portion of the first material and at least a portion of the second material are disposed on both sides of the boundary surface in a state in contact with each other at the boundary surface.

Wherein the first material and the second material have different electrical conductivity.

Wherein the first material includes carbon nanotube-polytetrafluoroethylene (CNT-PTFE), wherein the second material includes polytetrafluoroethylene (PTFE).

Wherein the frame includes a boundary side surface that forms the boundary surface, wherein the boundary side surface includes at least one of a parallel surface parallel to a central axis of the frame and an inclined surface formed inclined to a central axis of the frame.

Wherein the frame includes a plurality of auxiliary frames having boundary side surfaces of different diameters with respect to a central axis of the frame, wherein a first portion of the first material and a first portion of the second material are disposed on both sides based on a first boundary surface formed by a boundary side surface of a first auxiliary frame among the plurality of auxiliary frames, wherein a second portion of the first material and a second portion of the second material are disposed on both sides based on a second boundary surface formed by a boundary side surface of a second auxiliary frame among the plurality of auxiliary frames.

Details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIGS. 11 to 13(a), 13(b) and 13(c) are views for describing a heterogeneous composite material generated through step S150 of FIG. 1.

DETAILED DESCRIPTION OF THE INVENTION

Figure 1:
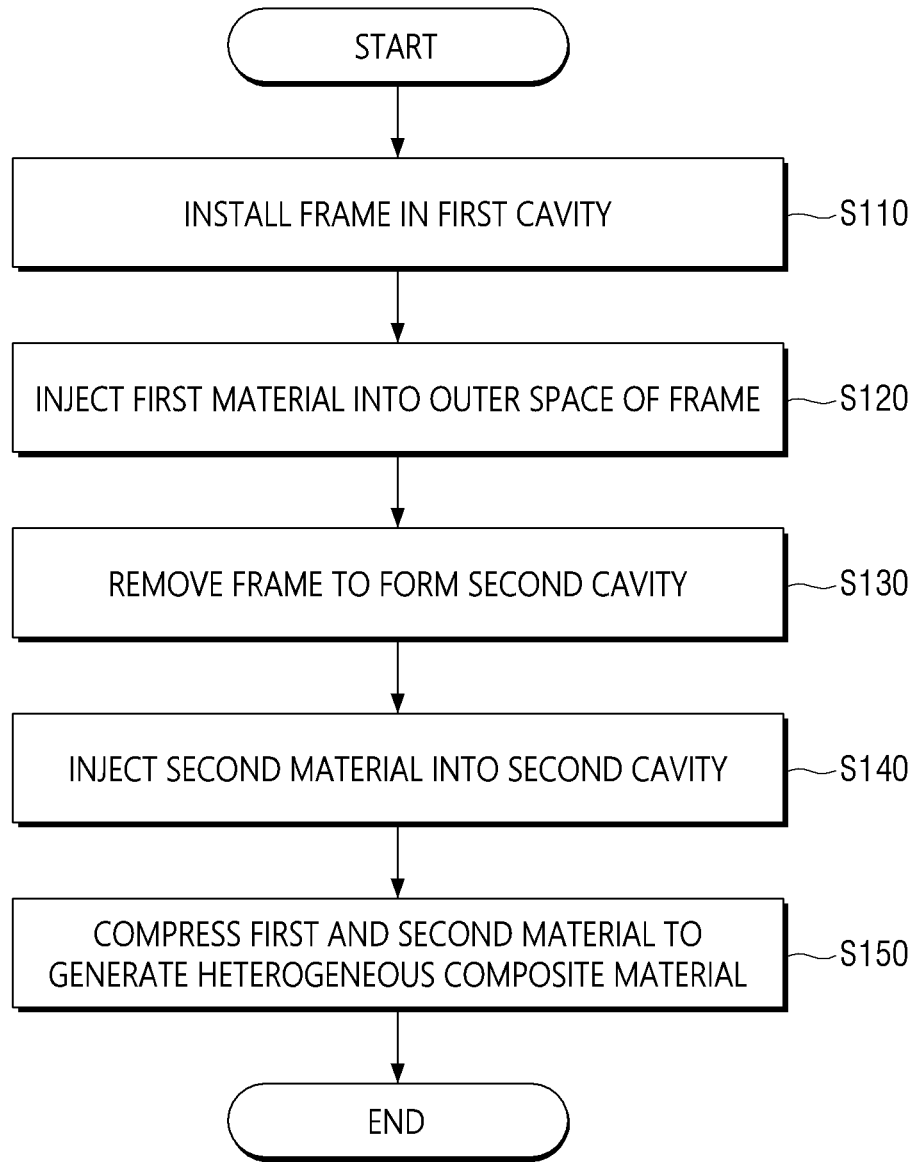
FIG. 1 is a flowchart showing a method of manufacturing a heterogeneous composite material according to an embodiment of the present invention.

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same elements throughout the specification.

When elements are referred to as "on" or "above" of other elements, it includes not only when directly above of the other elements, but also other elements intervened in the middle. On the other hand, when elements are referred to as "directly on" or "directly above," it indicates that no other element is intervened therebetween.

The spatially relative terms "below," "beneath," "lower," "above," "upper," etc., as shown in figures, can be used to easily describe the correlation of components or elements with other components or elements. The spatially relative terms should be understood as terms including the different direction of the element in use or operation in addition to the direction shown in the figure. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various components, elements and/or sections, these components, elements and/or sections are not limited by these terms. These terms are only used to distinguish one component, element, or section from another component, element or section. Therefore, first component, the first element or first section mentioned below may be a second component, second element, or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the elements, steps, operations and/or components mentioned above do not exclude the presence or additions of one or more other elements, steps, operations and/or components.

Unless otherwise defined, all terms (including technical and scientific terms) used in the present description may be used with meanings that can be commonly understood by those of ordinary skill in the art to which the present invention belongs. In addition, terms defined in a commonly used dictionary are not interpreted ideally or excessively unless explicitly defined specifically.

Hereinafter, exemplary embodiments of the present invention will be described in detail with reference to the accompanying drawings, and in the description with reference to the accompanying drawings, the same or corresponding elements are assigned the same reference numbers regardless of reference numerals, and the description overlapped therewith will be omitted.

FIG. 1 is a flowchart showing a method of manufacturing a heterogeneous composite material according to an embodiment of the present invention.

Referring to FIG. 1, a method of manufacturing a heterogeneous composite material according to an embodiment of the present invention comprises installing a frame in a first cavity formed in a mold (S110), injecting a first material into the outer space of the frame. (S120), removing the frame to form a second cavity (S130), injecting a second material into the second cavity (S140), and compressing the first material and the second material to generate a heterogeneous composite material (S150).

A method of manufacturing a heterogeneous composite material according to an embodiment of the present invention may be performed by a separate heterogeneous composite material manufacturing apparatus (not shown) manufactured to manufacture a heterogeneous composite material. The heterogeneous composite manufacturing apparatus may include at least one accessory equipment (not shown) to generate a heterogeneous composite material. The heterogeneous composite material may be used to produce a component applied to a semiconductor manufacturing equipment, but the application target of the heterogeneous composite material of the present invention is not limited to the semiconductor manufacturing equipment component.

Each accessory equipment provided in the heterogeneous composite manufacturing apparatus can perform a unique task. For example, one accessory device may perform one or more of the steps shown in FIG. 1, and a plurality of accessory devices may perform one of the steps shown in FIG. 1.

Hereinafter, each step shown in FIG. 1 will be described in detail with reference to FIGS. 2 to 13.

Figure 2:
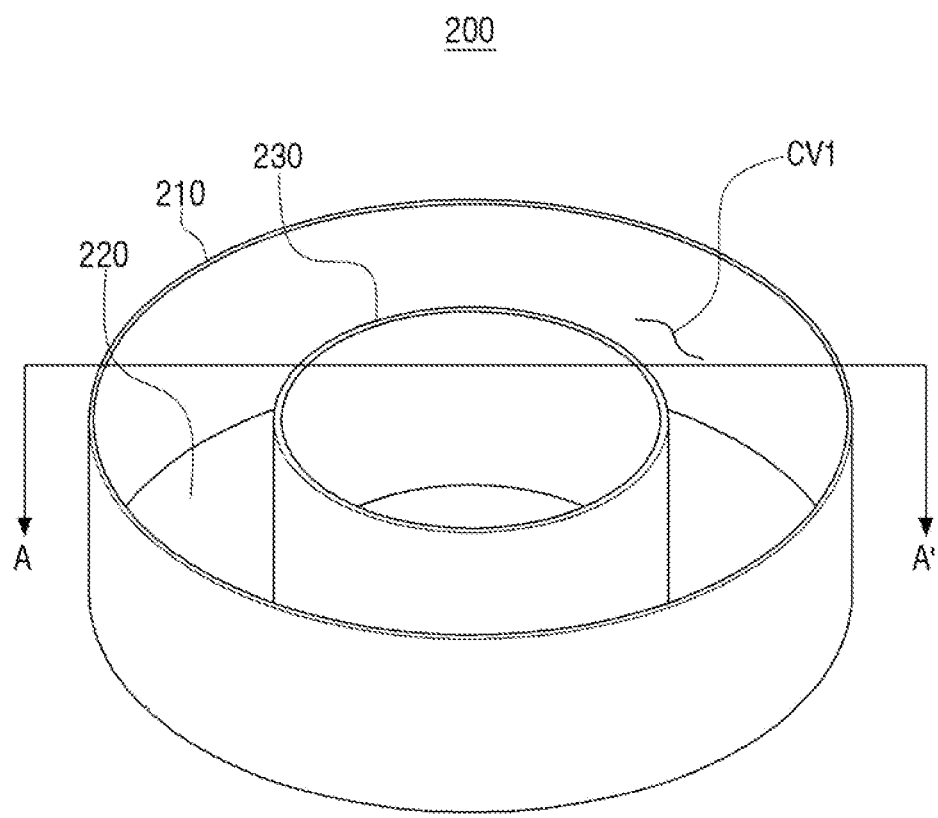
FIGS. 2 to 4 are views showing a mold having a first cavity in step S110 of FIG. 1.
Figure 3:
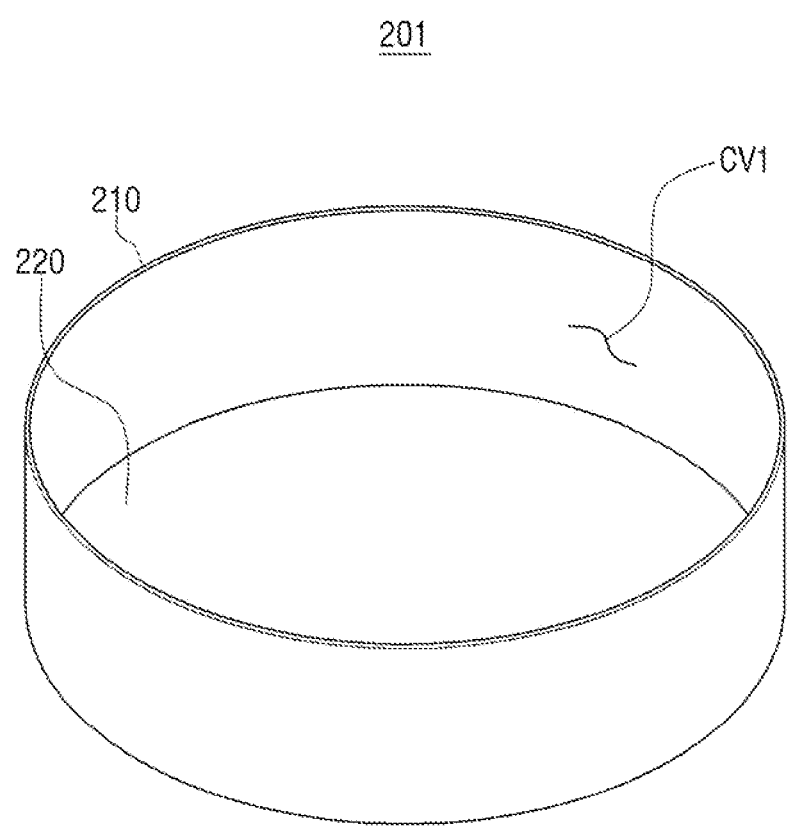
Figure 4:
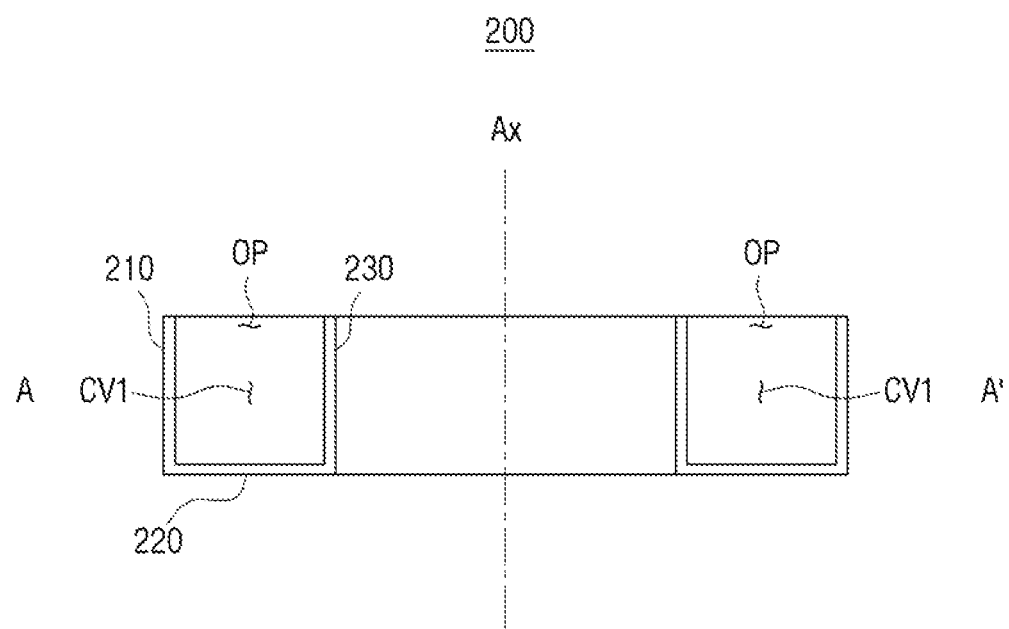
Figure 5:
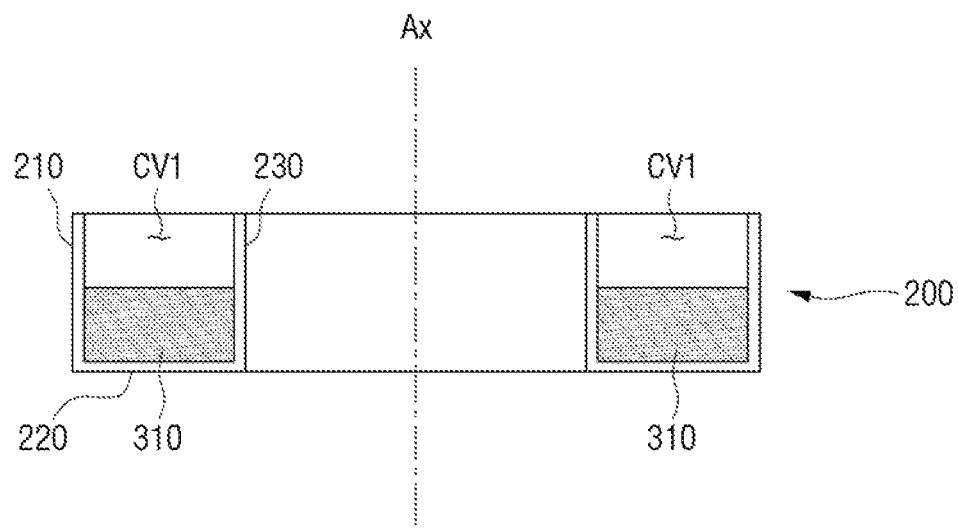
FIG. 5 is a view for describing that the first material is injected before step S110 of FIG. 1.
Figure 6:
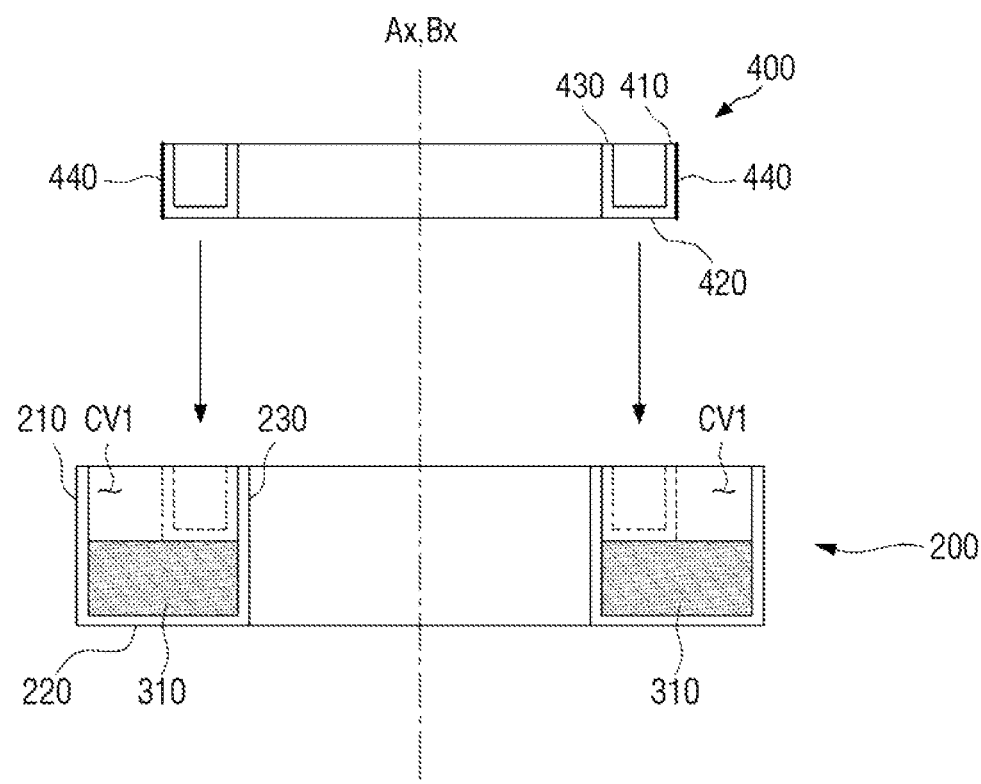
FIG. 6 is a diagram for describing step S110 of FIG. 1.
Figure 7:
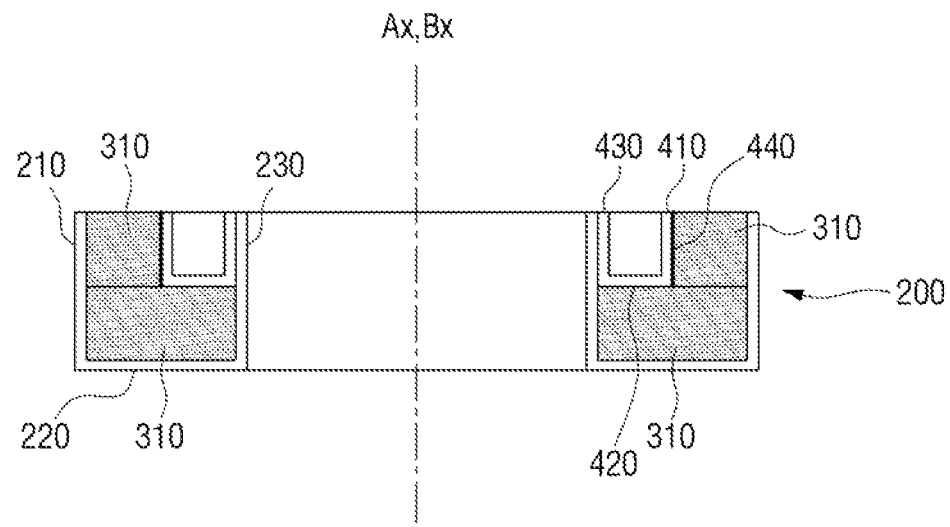
FIG. 7 is a diagram for describing step S120 of FIG. 1.
Figure 8:
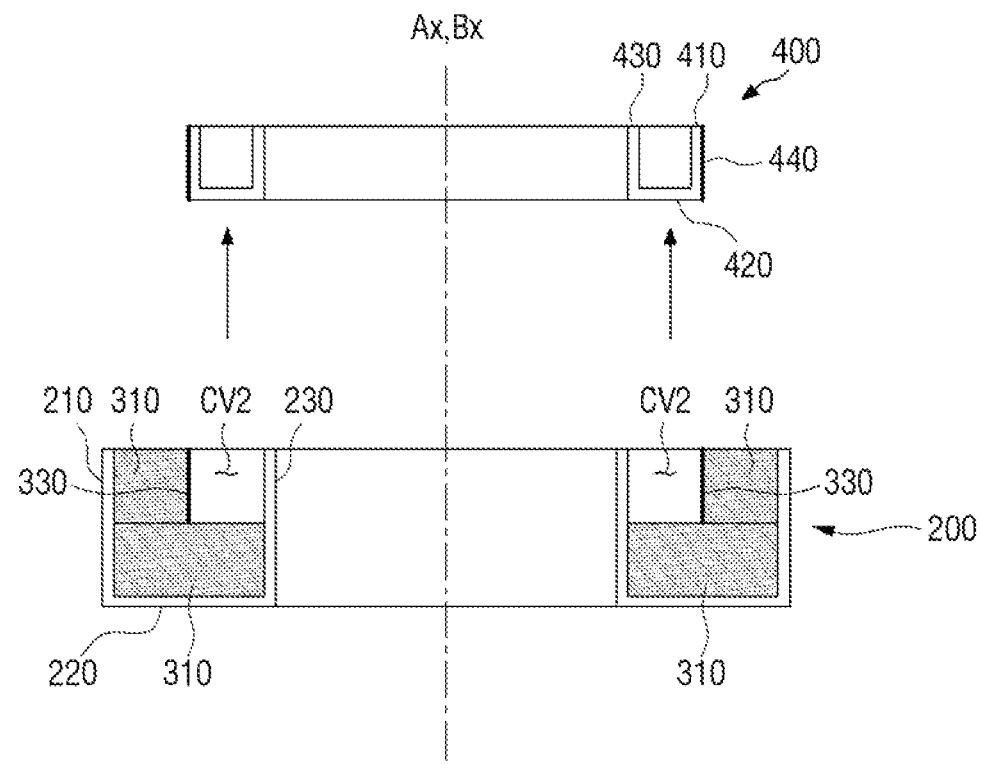
FIG. 8 is a diagram for describing step S130 of FIG. 1.
Figure 9:
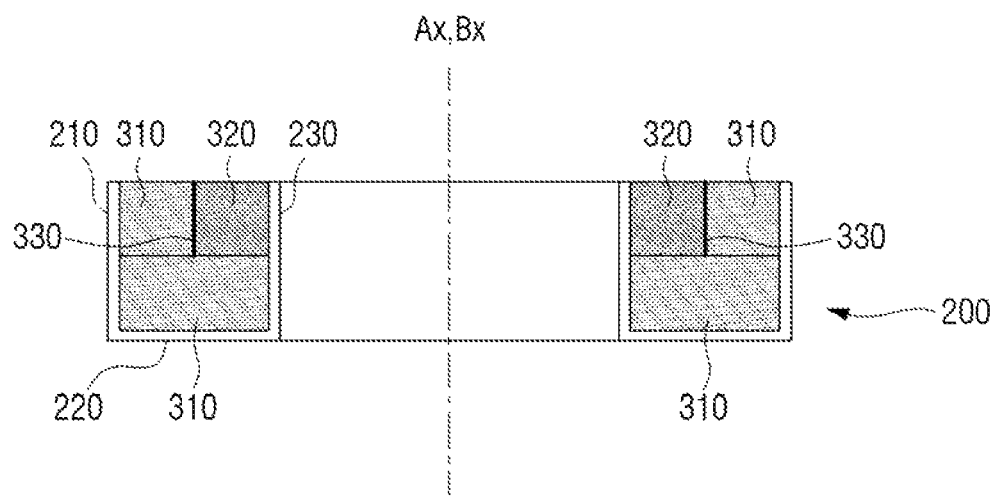
FIGS. 9 and 10 are diagrams for describing step S140 of FIG. 1.
Figure 10:
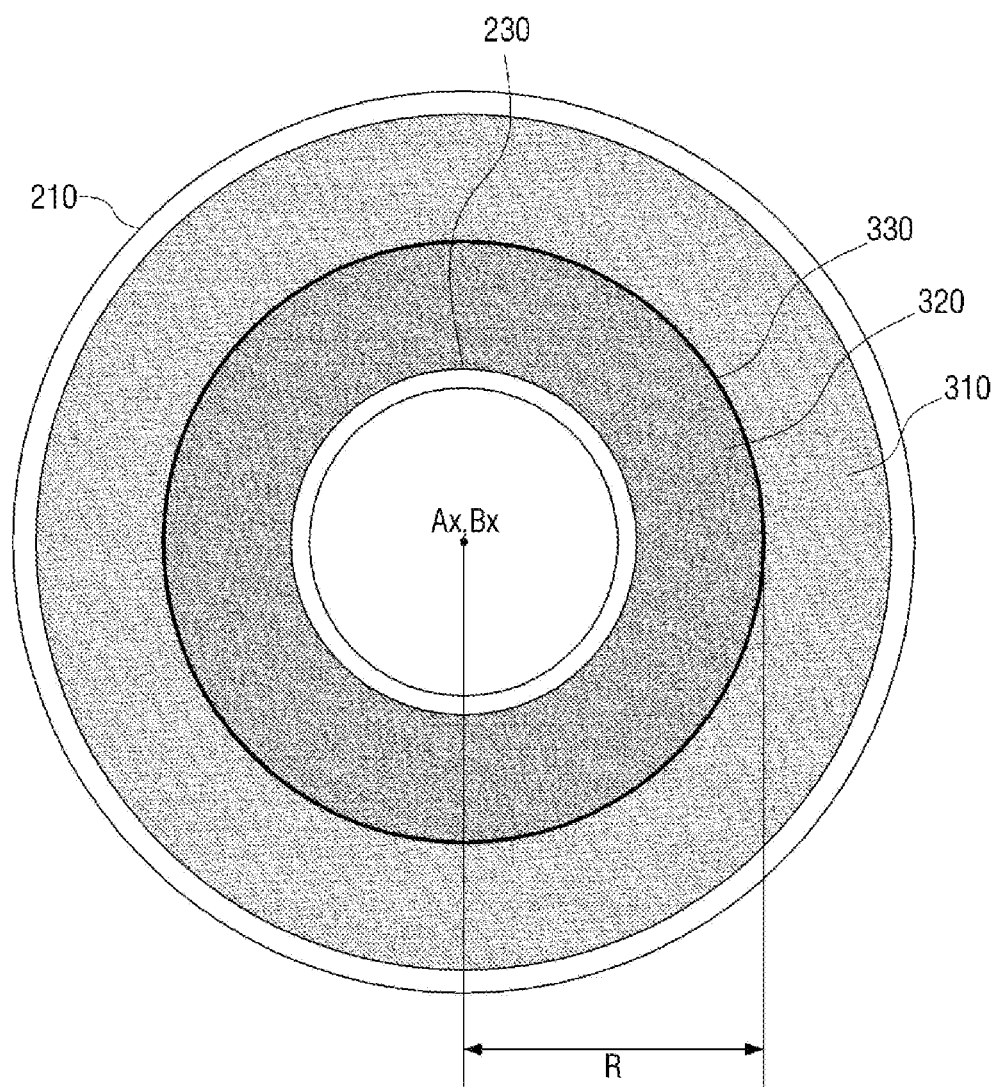

FIGS. 2 to 4 are views showing a mold having a first cavity in step S110 of FIG. 1, and FIG. 5 is a view for describing that the first material is injected before step S110 of FIG. 1, and FIG. 6 is a view for describing step S110 of FIG. 1, FIG. 7 is a diagram for describing step S120 of FIG. 1, FIG. 8 is a view for describing step S130 of FIG. 1, and FIGS. 9 and 10 are views for describing step S140 of FIG. 1, and FIGS. 11 to 13 are views for describing a heterogeneous composite material generated through step S150 of FIG. 1.

Referring to FIGS. 2 to 4, a mold 200 having a first cavity (CV1) may be prepared.

In the present invention, the molds 200 and 201 may be provided in the form of a cylinder or a hollow cylinder. Accordingly, the first cavity (CV1) provided in the molds 200 and 201 may also have a shape of a cylinder or a hollow cylinder. Here, the hollow cylinder refers to a cylinder, in which a hollow is formed.

When the heterogeneous composite material is generated by the heterogeneous composite material manufacturing apparatus, a compression operation on the material described below may be performed. As the first cavity (CV1), in which the material is accommodated, has the shape of a cylinder or a hollow cylinder, a uniform force can be transmitted to all of the material accommodated in the first cavity (CV1) during the compression operation.

FIG. 2 shows a mold 200 provided in the form of a hollow cylinder, and FIG. 3 shows a cross-sectional view taken along line A-A' of the mold shown in FIG. 2. FIG. 4 shows a mold 201 provided in the form of a cylinder.

Hereinafter, the mold 200 provided in the form of a hollow cylinder will be mainly described.

The mold 200 includes an outer plate 210, a bottom plate 220, and an inner plate 230. The outer plate 210 and the inner plate 230 may have different diameters with respect to the same central axis (Ax). The wide surfaces of the outer plate 210 and the inner plate 230 may be formed parallel to the central axis (Ax). The outer plate 210 and the inner plate 230 may be connected by the bottom plate 220, and a first cavity (CV1) may be formed by the outer plate 210, the bottom plate 220, and the inner plate 230. Meanwhile, when the mold 201 is provided in the form of a cylinder as shown in FIG. 4, the mold 201 may be configured to include an outer plate 210 and a bottom plate 220, and the first cavity (CV1) may be formed by the outer plate 210 and the bottom plate 220.

Referring again to FIGS. 2 and 3, the mold 200 may include an opening (OP) corresponding to a plane of one side of the first cavity (CV1). For example, the opening (OP) may be formed on the opposite side surface of the bottom plate 220. The opening (OP) may be used as a moving passage of materials and frames. For example, a first material and a second material to be described later may be injected through the opening (OP), and the frame may be inserted into the first cavity (CV1) or discharged from the first cavity (CV1) through the opening (OP).

Referring to FIG. 5, a first material 310 may be injected into a first cavity (CV1) formed in the mold 200.

The first material 310 is a material used to generate a heterogeneous composite material, and may be fluoroplastics. For example, the first material 310 may be a carbon nanotube-polytetrafluoroethylene (CNT-PTFE), but the first material 310 of the present invention is not limited to a carbon nanotube-polytetrafluoroethylene.

The first material 310 may be injected through the opening (OP) of the mold 200, and the injected first material 310 may be loaded upward direction from the bottom of the first cavity (CV1). The first material 310 may not be injected into the entire space of the first cavity (CV1). That is, some of the entire space of the first cavity (CV1) may not be filled by the first material 310.

As described later, the frame 400 may be installed in the first cavity (CV1). FIG. 5 shows that the first material 310 is injected into the first cavity (CV1) before the frame 400 is installed. According to an exemplary embodiment of the present invention, the first material 310 may or may not be injected into the first cavity (CV1) before the frame 400 is installed. Hereinafter, description will be made mainly on that the first material 310 is injected into the first cavity CV1 before the frame 400 is installed.

Referring to FIG. 6, the frame 400 may be installed in the first cavity (CV1).

The frame 400 may be inserted into the first cavity (CV1) through the opening (OP). As the first cavity (CV1) has the shape of a hollow cylinder, the frame 400 may also be provided in the shape of a hollow cylinder. That is, the central axis (Bx) of the frame 400 and the central axis (Ax) of the mold 200 may be coincided, and the frame 400 may have the shape of a hollow cylinder having a predetermined diameter with respect to the corresponding central axis (Bx).

The frame 400 may include an outer surface used to form a second cavity (CV2) (see FIG. 8), which will be described later. For example, the cross section of the outer surface of the frame 400 may be a square, and in this case, the cross section of the second cavity (CV2) may be a square.

The frame 400 is configured to include an outer plate 410, a bottom plate 420 and an inner plate 430. The outer plate 410 and the inner plate 430 may have different diameters with respect to the same central axis (Bx). The wide surfaces of the outer plate 410 and the inner plate 430 may be formed parallel to the central axis (Bx). The outer plate 410 and the inner plate 430 may be connected by the bottom plate 420, and a second cavity (CV2) may be formed by the outer plate 410, the bottom plate 420 and the inner plate 430.

It can be understood that the outer surface of the above-described frame 400 is an outer surface of the outer plate 410, the bottom plate 420 and the inner plate 430. The outer surface of the frame 400 may include a surface parallel to the direction, in which the frame 400 is inserted or discharged into the mold 200. That is, the outer surfaces of the outer plate 410 and the inner plate 430 may be parallel to the insertion or discharge direction of the frame 400.

As will be described later, the first material 310 and the second material 320 may be disposed on both sides of the boundary surface. The frame 400 may include a boundary side surface 440 forming a boundary surface. The boundary surface may be formed in a shape corresponding to the boundary side surface 440. The boundary side surface 440 may include at least one of a parallel surface parallel to the central axis (Bx) of the frame 400 and an inclined surface formed inclined to the central axis (Bx) of the frame 400. FIG. 6 shows that the boundary side surface 440 is configured only with a parallel plane parallel to the central axis (Bx).

Referring to FIG. 7, a first material 310 may be injected into the outer space of the frame 400. The first material 310 may be the same as the first material 310 injected before the step S110. The first material 310 may be injected through the opening (OP) of the mold 200. One side of the injected first material 310 may be in close contact with the boundary side surface 440 of the frame 400.

Referring to FIG. 8, the frame 400 may be removed from the mold 200 to form a second cavity (CV2). The frame 400 may be discharged from the first cavity (CV1) through the opening (OP) of the mold 200.

In the present invention, the first material 310 may be injected into the first cavity (CV1) in the form of powder. Further, each powder particle constituting the first material 310 may exert a bonding force of a predetermined amount or more with each other, and the shape may be maintained even when the frame 400 is removed.

Accordingly, as the frame 400 is removed from the first material 310, a second cavity (CV2) having a shape corresponding to the outer surface of the frame 400 may be formed. That is, the second cavity (CV2) may have the shape of a hollow cylinder like the frame 400. In this case, the second cavity (CV2) may include a boundary surface 330 in contact with the first material 310.

As described above, the inner plate 430 of the frame 400 and the outer surface of the outer plate 410 may be parallel to the insertion or discharge direction of the frame 400. Accordingly, even if the frame 400 is removed from the first material 310, the shape of the first material 310 may be maintained as it is.

Referring to FIGS. 9 and 10, a second material 320 different from the first material 310 may be injected into the second cavity (CV2). The second material 320 may be injected through the opening (OP) of the mold 200. The second material 320 may be injected into the second cavity (CV2) in the form of powder.

The second material 320 may be fluoroplastics. The second material 320 may have a powder form similar to that of the first material 310, and when the first material 310 and the second material 320 are accommodated in the same space and compressed, the first material 310 and the second material 320 may be harmoniously fused. For example, the second material 320 may be Carbon Nanotube-polytetrafluoroethylene (PTFE), but the second material 320 of the present invention is not limited to polytetrafluoroethylene.

A boundary surface 330 may exist between the first material 310 and the second material 320. The boundary surface 330 may exist in a circular shape having a predetermined radius (R) with respect to the central axis (Bx) of the frame 400.

At least a portion of the first material 310 and at least a portion of the second material 320 may be disposed on both sides of the boundary surface 330 in a state in contact with each other at the boundary surface 330. In other words, a portion of the first material 310 and a portion of the second material 320 may have different radii with respect to the central axis (Bx) of the frame 400.

In the mold 200, the materials 310 and 320 may be disposed as a mixed layer or a single layer. The mixed layer is a layer including the first material 310 and the second material 320, and the single layer represents a layer including only the first material or the second material. At least one of a mixed layer and a single layer may be disposed on the mold, and in particular, at least one mixed layer may be disposed on the mold. FIG. 9 shows that a single layer composed of only the first material 310 and a mixed layer including the first material 310 and the second material 320 are disposed in the mold 200. However, this is illustrative, and a mixed layer and a single layer may be combined in various forms and disposed in the mold 200.

As described above, the first material 310 is a material used to generate a heterogeneous composite material, and may be fluoroplastic. The first material 310 may be a carbon nanotube-polytetrafluoroethylene (hereinafter referred to as CNT-PTFE). CNT-PTFE may be formed with a relatively high unit cost.

When CNT-PTFE is all filled in the first cavity (CV1), a heterogeneous composite material is generated, and when a semiconductor manufacturing equipment component is manufactured through this, waste of CNT-PTFE may occur. The heterogeneous composite material may be cut or polished to generate a semiconductor manufacturing equipment component. The cut or polished portion of the entire region of the heterogeneous composite material is a portion that cannot be reused, and thus, waste of cost may occur. In addition, when the frame 400 or the like is inserted into the first cavity (CV1) and compressed, cracks may occur in the heterogeneous composite material.

Accordingly, a portion of the entire region of the heterogeneous composite material that is not used for generation of semiconductor manufacturing equipment components may be filled with polytetrafluoroethylene (hereinafter referred to as PTFE), which has a relatively low unit cost. When compression is performed while the first cavity (CV1) is wholly filled with CNT-PTFE and PTFE, cracks do not occur in the compression result, and waste of CNT-PTFE can be prevented.

The pressure is applied to the first material 310 and the second material 320 through the opening (OP) of the mold 200 while the first cavity CV1 of the mold 200 is filled with the first material 310 and the second material 320 so that the first material 310 and the second material 320 can be compressed simultaneously. In this case, heat may be applied to the first material 310 and the second material 320.

Figure 11:
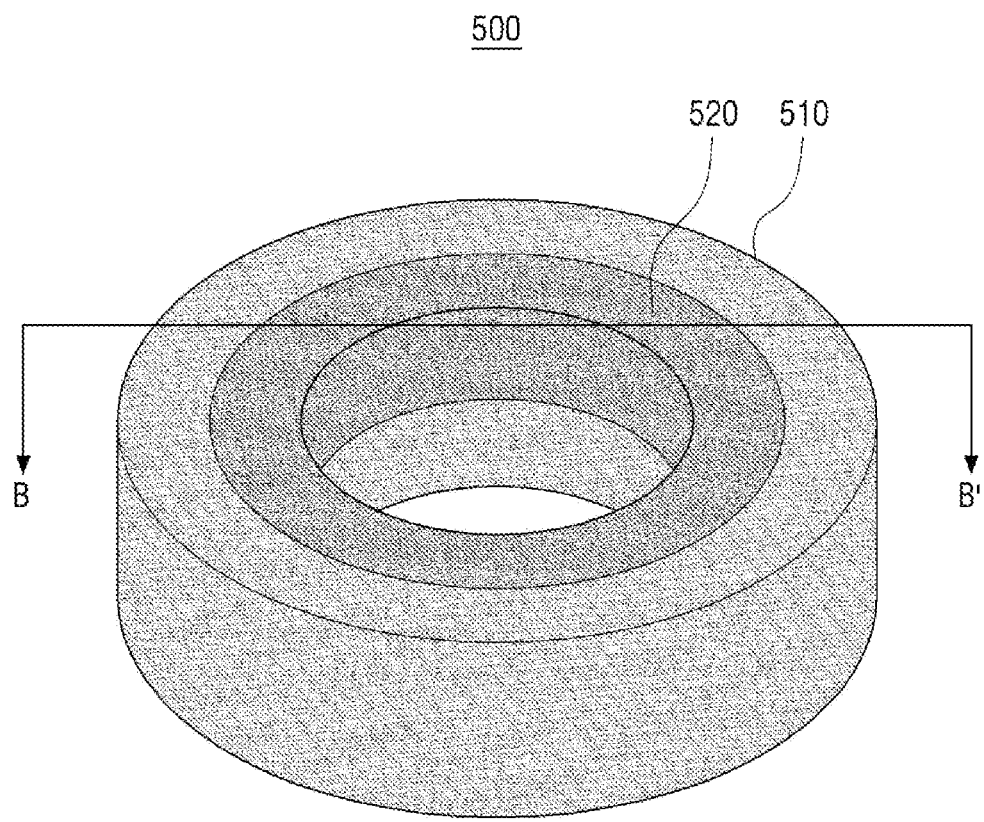

By pressure and heat, the first material 310 and the second material 320 may be melted and cured to be converted into a heterogeneous composite material 500 (see FIG. 11). Like the first cavity CV1, the heterogeneous composite material 500 may have a shape of a hollow cylinder.

Figure 12:
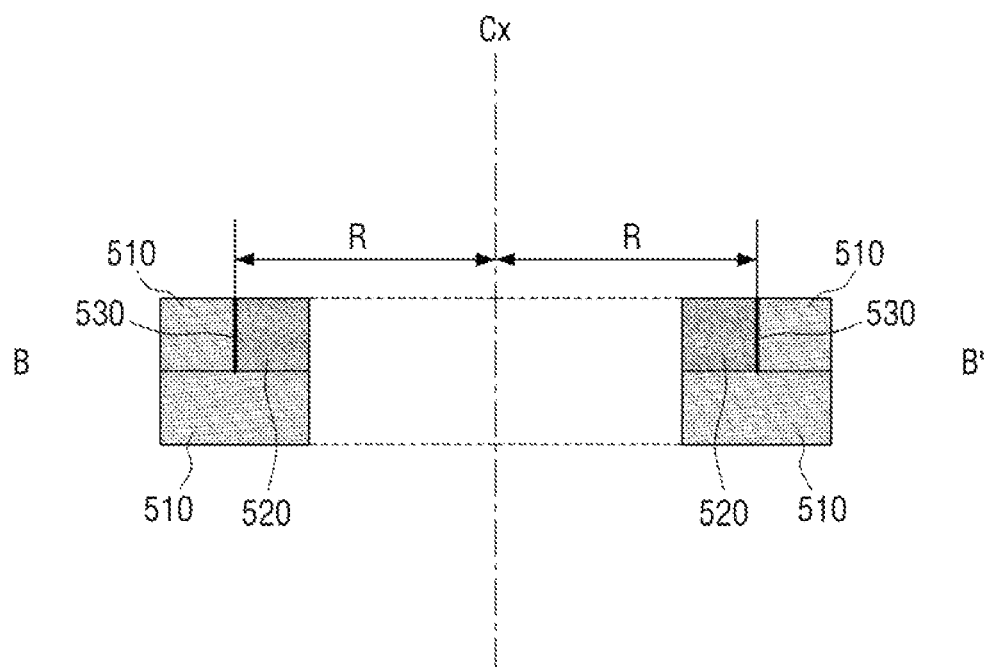
Figure 13:
Figure 13:
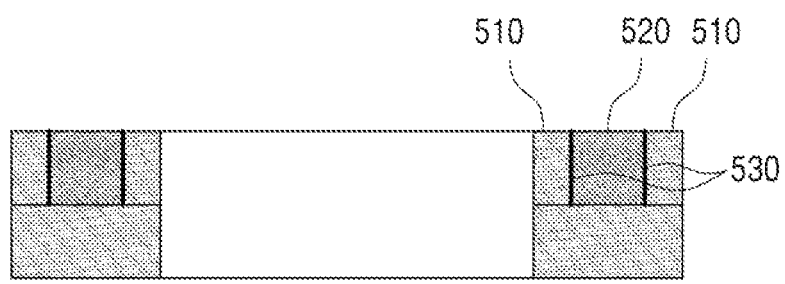
Figure 13:
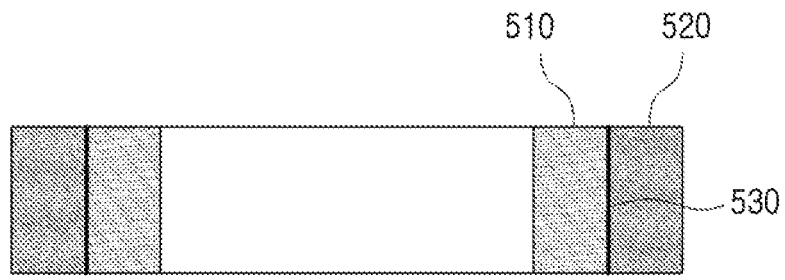

Referring to FIGS. 11 to 13, the heterogeneous composite material 500 may include a first compression structure 510 and a second compression structure 520.

The first compression structure 510 may be formed by compressing the first material 310, and the second compression structure 520 may be formed by compressing the second material 320 different from the first material 310. The second compression structure 520 may be disposed in close contact with the first compression structure 510.

At least a portion of the first compression structure 510 and at least a portion of the second compression structure 520 may be disposed on both sides of a boundary surface 530 that has a predetermined radius (R) with respect to the central axis (Cx) and exists in a circular shape in a state in contact with each other at the boundary surface 530. Here, the boundary surface 530 may correspond to the boundary surface 330 of the materials 310 and 320 described above.

The boundary surface 530 may include at least one of a parallel surface parallel to the central axis (Cx) and an inclined surface formed inclined to the central axis (Cx). FIG. 12 shows that the boundary surface 530 is configured only with parallel surfaces.

The heterogeneous composite material 500 may include a mixed layer and a single layer. The mixed layer is a layer including a portion of the first compression structure 510 and a portion of the second compression structure 520, and the single layer represents a layer including only a portion of the first compression structure 510 or a portion of the second compression structure 520. The heterogeneous composite material 500 may include at least one of a mixed layer and a single layer, and in particular, may include at least one mixed layer. FIG. 12 shows that the heterogeneous composite material 500 comprises a single layer composed of only the first compression structure 510 and a mixed layer including the first compression structure 510 and the second compression structure 520. However, this is illustrative, and a mixed layer and a single layer may be variously combined to form a heterogeneous composite material 500.

Figure 14:
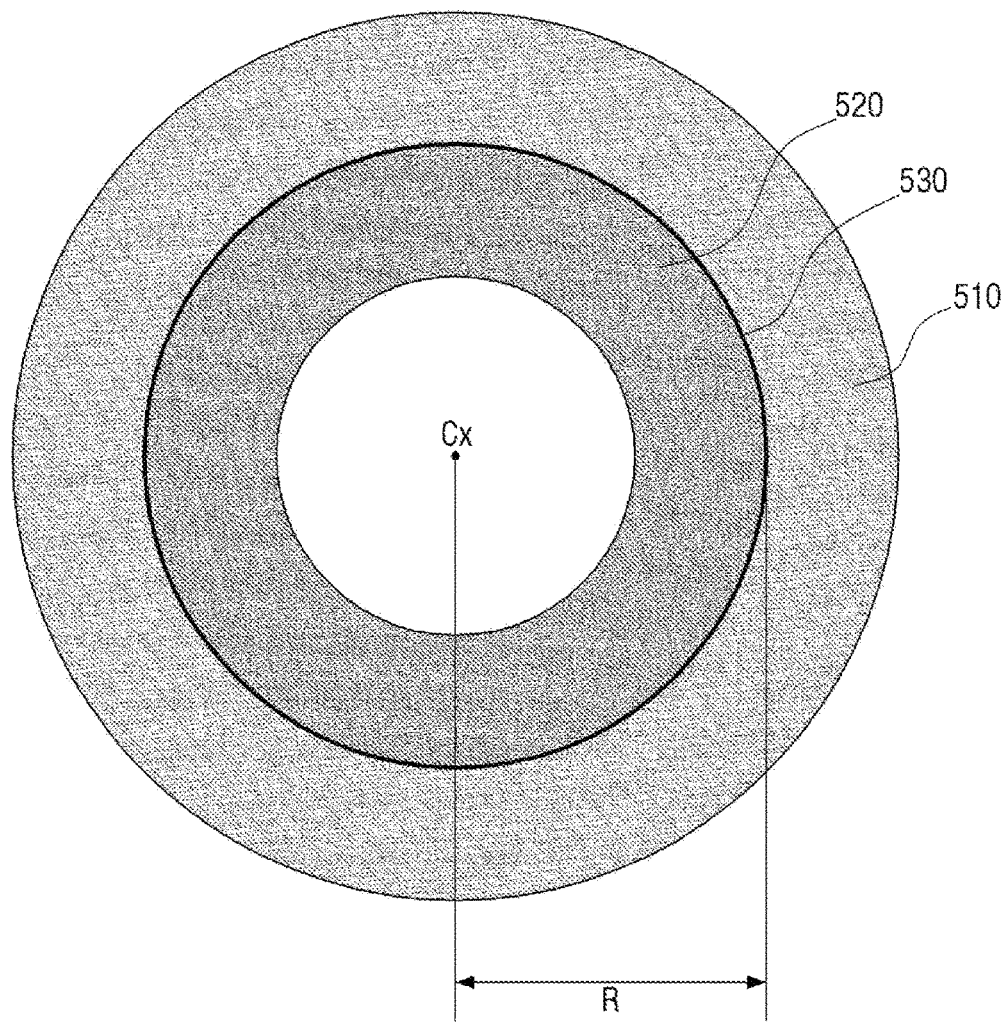
FIGS. 14 and 15 are views showing a heterogeneous composite material according to some embodiments of the present invention.

FIG. 14 shows a heterogeneous composite material, in which a mixed layer and a single layer are combined in various forms. (a) and (b) show that a heterogeneous composite material is formed including one single layer and one mixed layer, and (c) shows that a heterogeneous composite material is formed including only one mixed layer. The arrangement shape of the first compression structure 510 and the second compression structure 520 may be variously determined according to the form of the finally produced semiconductor manufacturing equipment component.

Figure 15:
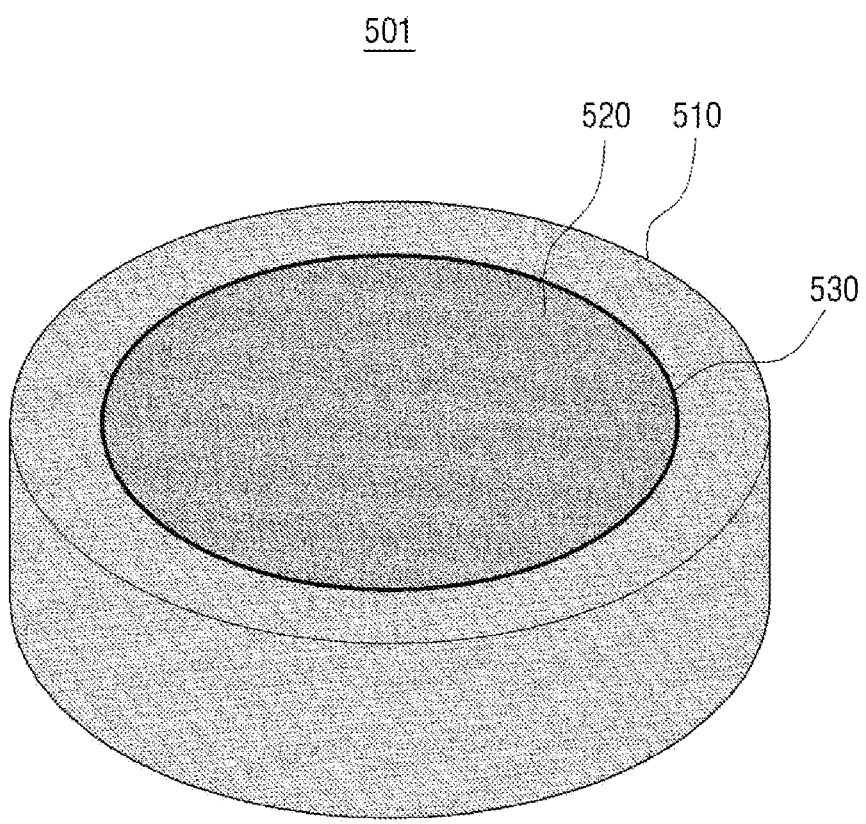

The heterogeneous composite material 500 manufactured in the form of a hollow cylinder has been described, but the heterogeneous composite material 501 may be manufactured in the form of a cylinder as shown in FIG. 15. The heterogeneous composite material 501 may include a first compression structure 510 and a second compression structure 520, and the heterogeneous composite material 501 may be manufactured in the form of a cylinder that does not include a hollow. To this end, as shown in FIG. 4, the mold 201 may not include a hollow, and the first cavity CV1 may provide a space for the cylinder.

Referring back to FIGS. 11 to 13, the heterogeneous composite material 500 shown in FIGS. 11 to 13 may be processed to produce a semiconductor manufacturing equipment component. In particular, the semiconductor manufacturing equipment component may include at least one of the first compression structure 510 and the second compression structure 520.

Figure 16:
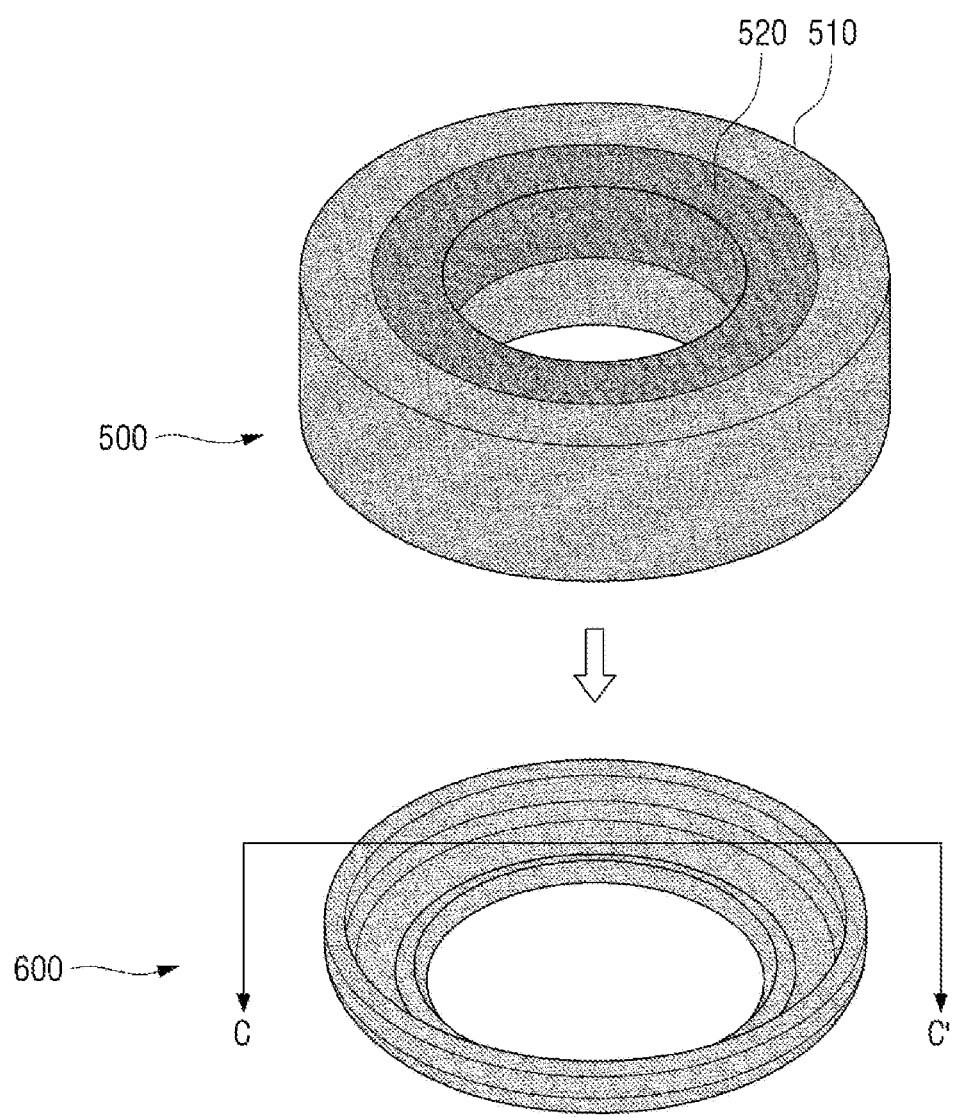
FIG. 16 is a view for describing that a heterogeneous composite material is processed to produce a semiconductor manufacturing equipment component.
Figure 17:
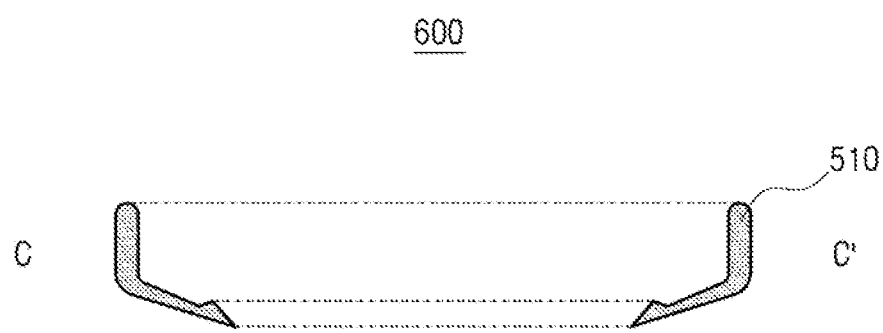
FIG. 17 is a cross-sectional view taken along line C-C' of the semiconductor manufacturing equipment component shown in FIG. 16.
Figure 18:
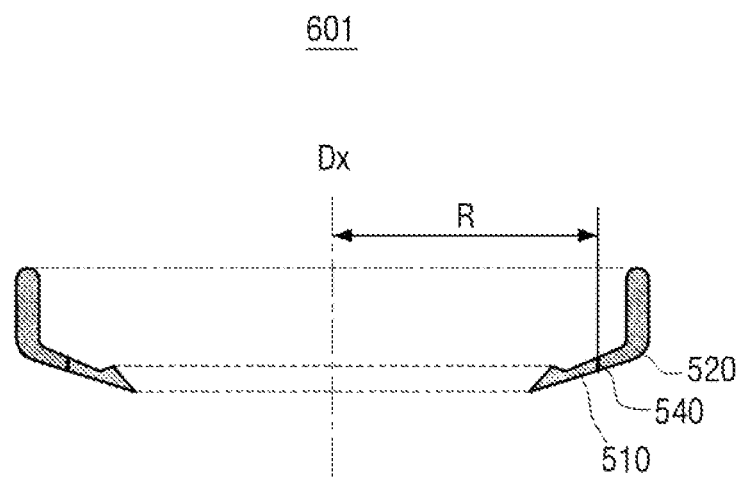
FIG. 18 is a diagram for describing that a semiconductor manufacturing equipment component is formed by a plurality of materials.

FIG. 16 is a diagram for describing that a heterogeneous composite material is processed to produce a semiconductor manufacturing equipment component, FIG. 17 is a cross-sectional view taken along C-C' of the semiconductor manufacturing equipment component shown in FIG. 16, and FIG. 18 is a diagram for describing that a semiconductor manufacturing equipment component is formed by a plurality of material.

Referring to FIGS. 16 and 17, the heterogeneous composite material 500 may be processed to produce a semiconductor manufacturing equipment component 600.

The heterogeneous composite material 500 may be cut and polished to produce a semiconductor manufacturing equipment component 600. FIGS. 16 and 17 show that the semiconductor manufacturing equipment component 600 is produced including only the first compression structure 510. In other words, the second compression structure 520 is all cut and removed. The unit cost of the first material 310 used to generate the first compression structure 510 may be high, but as a relatively inexpensive second material 320 is used, the cost consumed to produce the semiconductor manufacturing equipment component 600 can be reduced as a whole.

Meanwhile, FIGS. 16 and 17 show that the semiconductor manufacturing equipment component 600 is generated including only the first compression structure 510, but as shown in FIG. 18, a semiconductor manufacturing equipment component 601 may be produced including both the first compression structure 510 and the second compression structure 520.

In this case, the semiconductor manufacturing equipment component may include a first portion and a second portion. The first portion may have a first physical property, and the second portion may have a second physical property different from the first physical property. For example, the first portion and the second portion may have different electrical conductivity. More specifically, the first portion may include carbon nanotube-polytetrafluoroethylene (CNT-PTFE), and the second portion may include polytetrafluoroethylene (PTFE).

The second portion can directly contact the first portion. Here, the first portion may represent a portion composed of the first compression structure 510, and the second portion may represent a portion composed of the second compression structure 520. Specifically, at least a portion of the first portion and at least a portion of the second portion may be disposed on both sides of a boundary surface 540 that has a predetermined radius (R) with respect to the central axis (Dx) and exists in a circular shape in a state in contact with each other in the boundary surface 540. Here, the boundary surface 540 may be formed parallel to or inclined to the central axis (Dx).

In the present invention, the semiconductor manufacturing equipment components 600 and 601 may be disposed adjacent to a substrate (not shown). When static electricity is generated in the semiconductor manufacturing equipment components 600 and 601, it may adversely affect the substrate. As shown in FIGS. 16 and 17, when the semiconductor manufacturing equipment component 600 includes only the first compression structure 510 having relatively high electrical conductivity, generation of static electricity can be prevented. In addition, as shown in FIG. 18, when the first compression structure 510 is included on the inside of the semiconductor manufacturing equipment component 601 adjacent to the substrate, and the second compression structure 520 is included on the outside far from the substrate, it is possible to reduce the manufacturing cost of the semiconductor manufacturing equipment component 601 while preventing the occurrence of static electricity.

Figure 19:
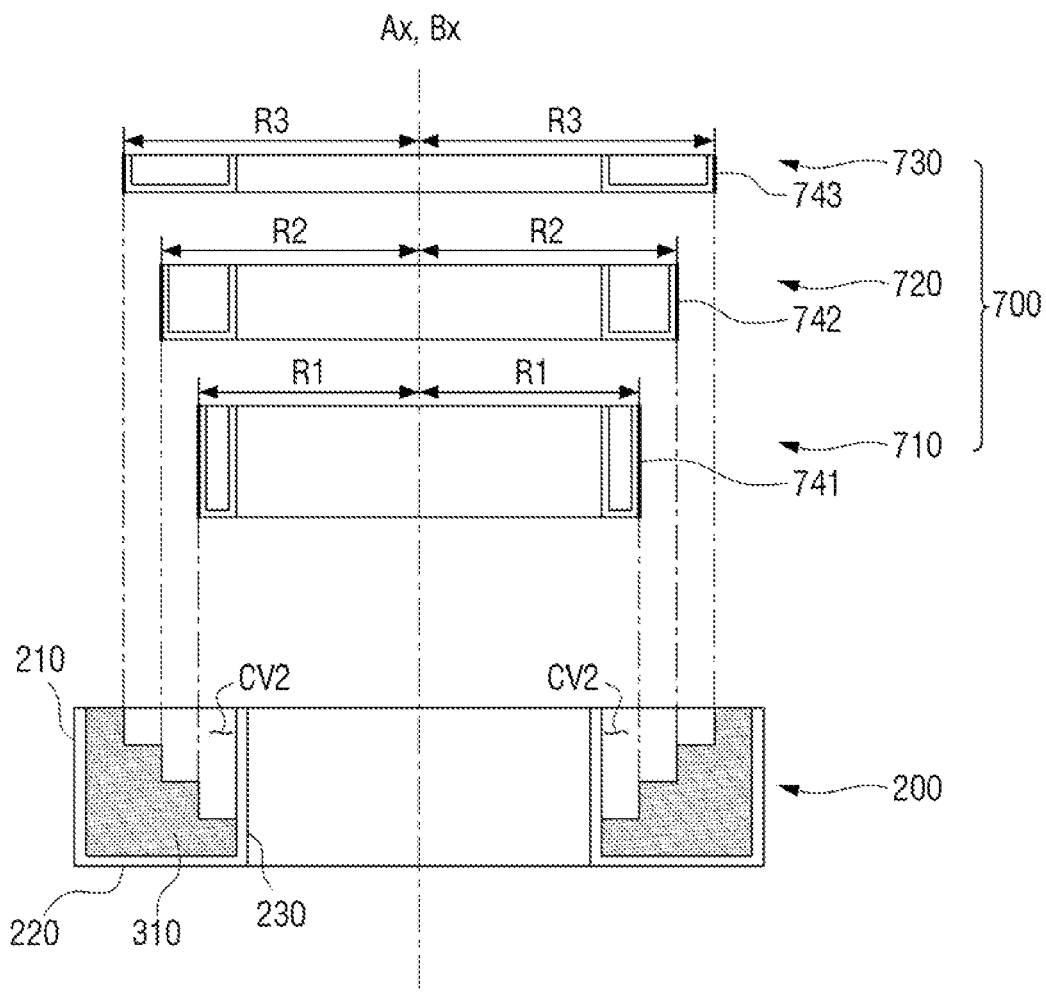
FIGS. 19 and 20 are views for describing that a second cavity is formed by a plurality of auxiliary frames.
Figure 20:
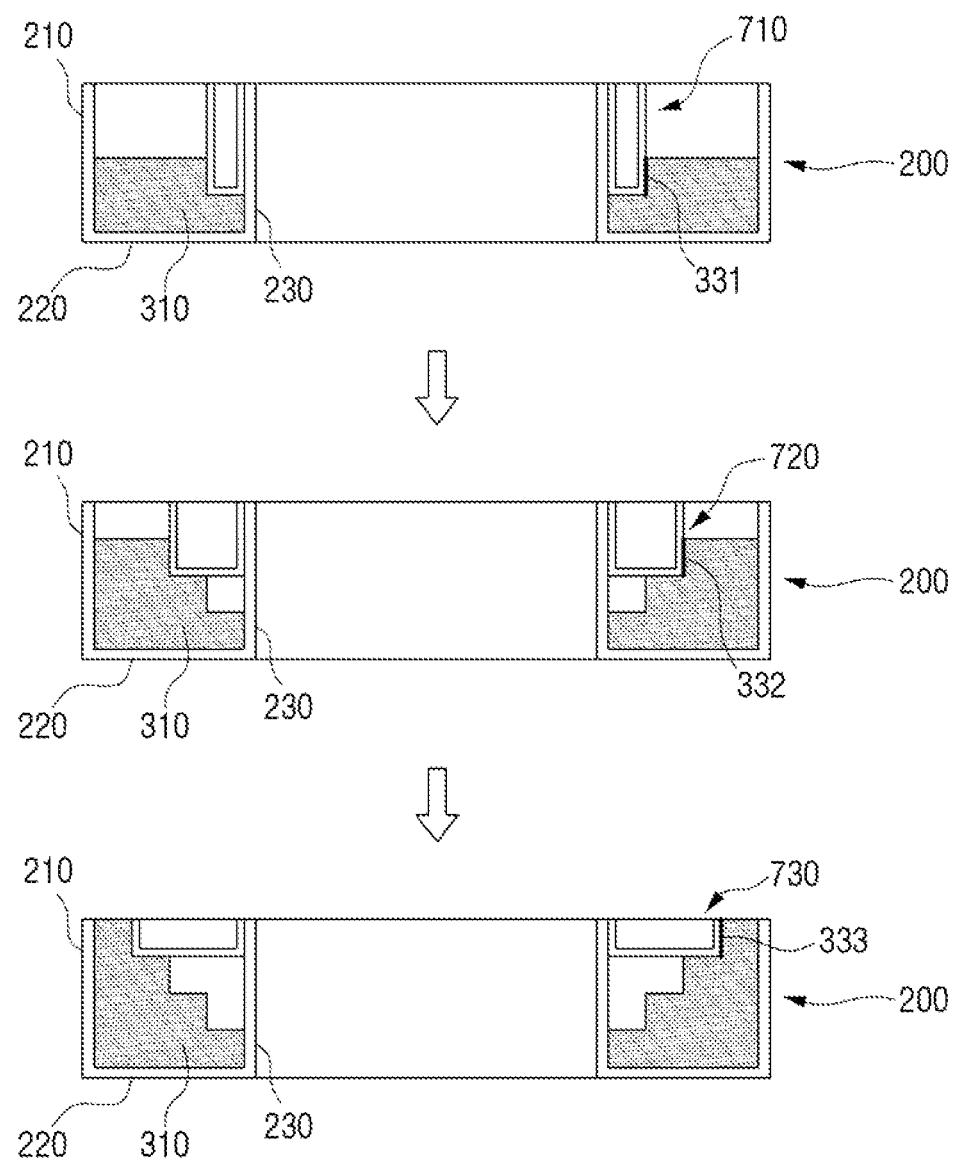
Figure 21:
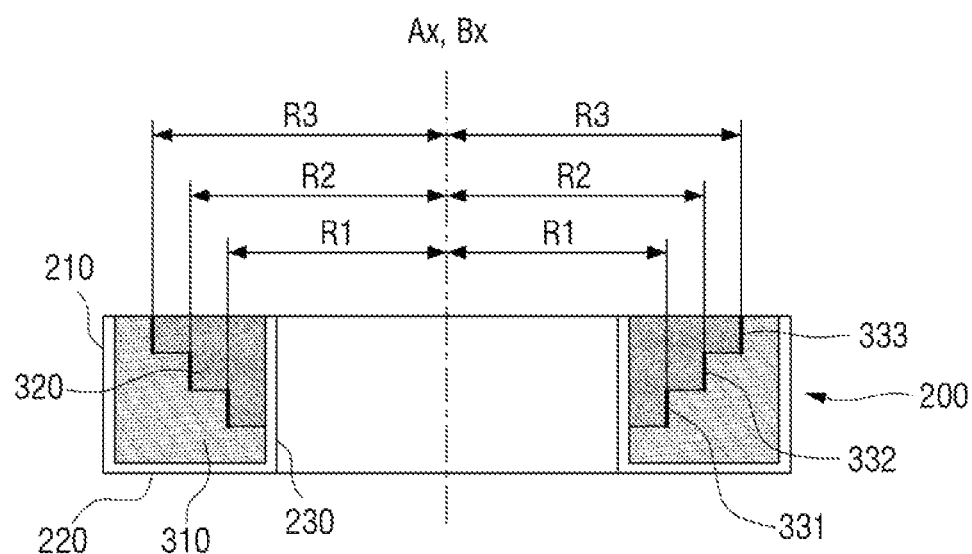
FIG. 21 is a view for describing that a second material is injected into the mold shown in FIG. 19.
Figure 22:
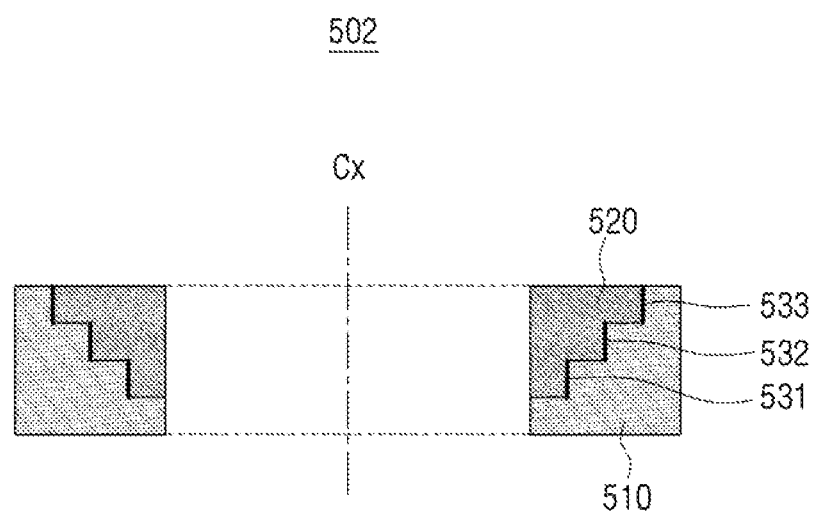
FIG. 22 is a view showing a heterogeneous composite material generated through the mold shown in FIG. 21.

FIGS. 19 and 20 are views for describing that a second cavity is formed by a plurality of auxiliary frames, and FIG. 21 is a view for describing that a second material is injected into the mold shown in FIG. 19, and FIG. 22 is a diagram showing a heterogeneous composite material generated through the mold shown in FIG. 21.

Referring to FIG. 19, the frame 700 may include a plurality of auxiliary frames 710, 720, 730 having boundary side surfaces 741, 742, 743 of different radii (R1, R2, R3) with respect to the central axis (Bx) of the frame 700.

The auxiliary frames 710, 720, and 730 having different radii may be used to form the second cavity (CV2).

Referring to FIGS. 19 and 20, boundary surfaces 331, 332, and 333 may be formed in a shape corresponding to the boundary side surfaces 741, 742, and 743.

While the first auxiliary frame 710 is inserted into the mold 200, the first material 310 may be injected to form the first boundary surface 331. Subsequently, while the first auxiliary frame 710 is removed and the second auxiliary frame 720 is inserted into the mold 200, the first material 310 may be injected to form the second boundary surface 332. Subsequently, while the second auxiliary frame 720 is removed and the third auxiliary frame 730 is inserted into the mold 200, the first material 310 may be injected to form a third boundary surface 333.

FIGS. 19 and 20 illustrate that the boundary surfaces 331, 332, and 333 are formed by the three auxiliary frames 710, 720, and 730, but this is illustrative and the boundary surface may be formed by two auxiliary frames or may be formed by more than four auxiliary frames.

Referring to FIG. 21, a first portion of the first material 310 and a first portion of the second material 320 may be disposed on both sides based on the first boundary surface 331 formed by a boundary side surface 741 of the first auxiliary frame 710 among a plurality of auxiliary frames 710, 720, and 730. Further, the second portion of the first material 310 and the second portion of the second material 320 may be disposed on both sides based on the second boundary surface 332 formed by the second auxiliary frame 720 among a plurality of auxiliary frames 710, 720, 730. In addition, a third portion of the first material 310 and a third portion of the second material 320 may be disposed on both sides based on the third boundary surface 333 formed by the boundary side surface 743 of the third auxiliary frame 730 among the plurality of auxiliary frames 710, 720, and 730.

As the auxiliary frames 710, 720, 730 having different radii are used to form the second cavity (CV2), the first material 310 and the second material 320 corresponding to the detailed shape of the semiconductor manufacturing equipment component can be disposed, and waste of materials having a high unit cost can be prevented.

Referring to FIG. 22, a heterogeneous composite material 502 including a first compression structure 510 and a second compression structure 520 may be generated.

The heterogeneous composite material 502 may be generated by compressing and heating the first material 310 and the second material 320 injected into the frame 200 of FIG. 21.

The heterogeneous composite material 502 may include a plurality of detailed boundary surfaces 531, 532, and 533 having different radii. The first portion of the first compression structure 510 and the first portion of the second compression structure 520 may be disposed on both sides of the first detailed boundary surface 531 in a state in contact with each other at the first detailed boundary surface 531 among the plurality of detailed boundary surfaces 531, 532, and 533, and the second portion of the first compression structure 510 and the second portion of the second compression structure 520 may be disposed on both sides of the second detailed boundary surface 532 in a state in contact with each other at the second detailed boundary surface 532 among the plurality of detailed boundary surfaces 531, 532, 533 Further, a third portion of the first compression structure 510 and a third portion of the second compression structure 520 may be disposed on both sides of the third detailed boundary surface 533 in a state in contact with each other at the third detailed boundary surface 533 among the plurality of detailed boundary surfaces 531, 532, and 533.

The heterogeneous composite material 502 may be processed to produce semiconductor manufacturing equipment components. Since the first compression structure 510 and the second compression structure 520 are disposed in a detailed structure, the cost consumed to manufacture the semiconductor manufacturing equipment component can be reduced as a whole.

Figure 23:
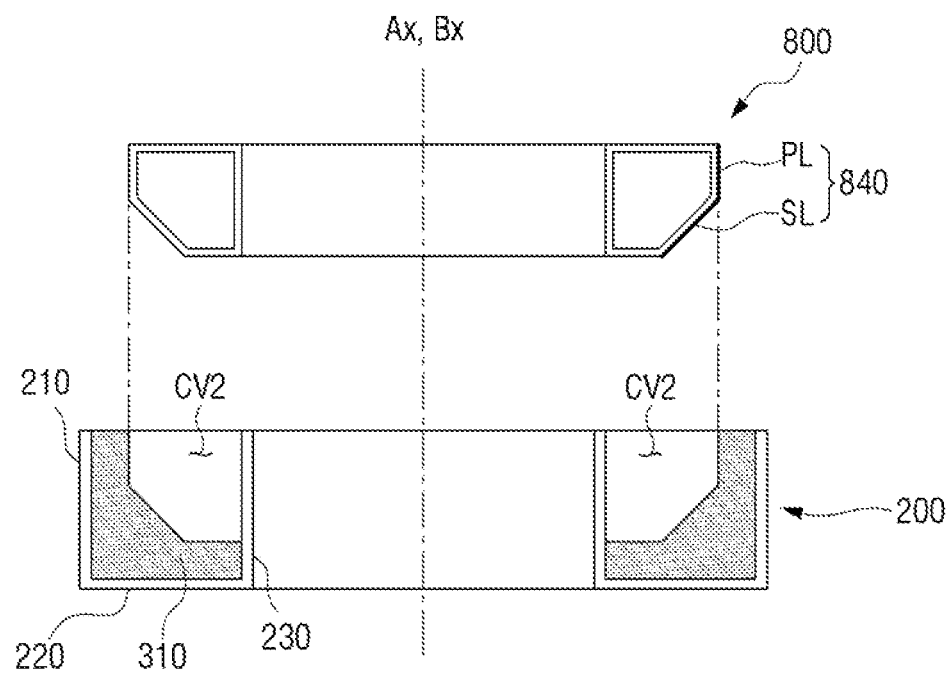
FIG. 23 is a view for describing that a second cavity is formed by a frame including an inclined surface.
Figure 24:
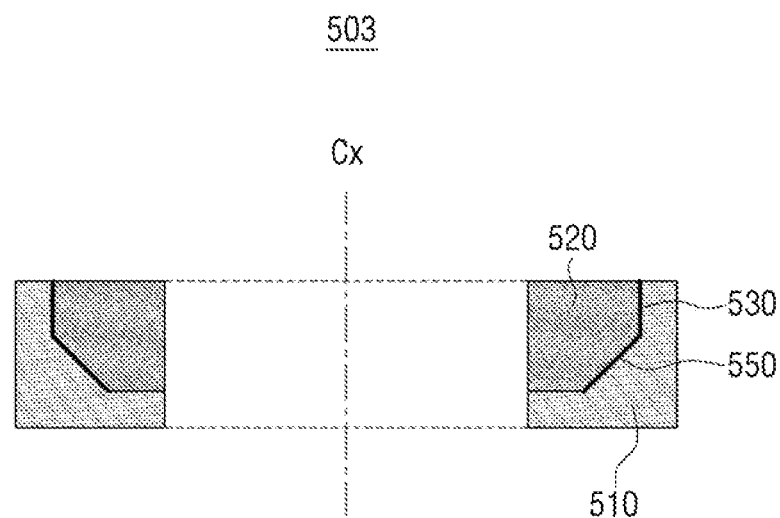
FIG. 24 is a view showing a heterogeneous composite material generated through the mold shown in FIG. 23.

FIG. 23 is a view for describing that a second cavity is formed by a frame including an inclined surface, and FIG. 24 is a view showing a heterogeneous composite material generated through the mold shown in FIG. 23.

Referring to FIG. 23, the frame 800 may include a boundary side surface 840 forming a boundary surface.

The boundary side surface 840 may include at least one of a parallel surface (PL) parallel to the central axis (Bx) of the frame 200 and an inclined surface (SL) formed inclined to the central axis (Bx) of the frame 200. FIG. 23 illustrates that the boundary side surface 840 is formed including the parallel surface (PL) and the inclined surface (SL).

As the frame 800 having the inclined surface (SL) is used to form the second cavity (CV2), it is possible to dispose the first material 310 and the second material 320 corresponding to the detailed shape of the heterogeneous composite material, and waste of materials with high unit cost can be prevented.

Referring to FIG. 24, a heterogeneous composite material 503 including a first compression structure 510 and a second compression structure 520 may be generated.

The heterogeneous composite material 503 may be generated by compressing and heating the first material 310 and the second material 320 injected into the frame 200 of FIG. 23.

The heterogeneous composite material 503 may include boundary surfaces 530 and 550 that have a predetermined radius with respect to the central axis (Cx) and exist in a circular shape. The boundary surfaces 530 and 550 may include at least one of a parallel surface 530 parallel to the central axis (Cx) and an inclined surface 550 formed inclined to the central axis (Cx).

At least a portion of the first compression structure 510 and at least a portion of the second compression structure 520 may be disposed on both sides of the boundary surfaces 530 and 550 in a state in contact with each other at the boundary surfaces 530 and 550.

The heterogeneous composite material 503 may be processed to produce a semiconductor manufacturing equipment component. Since the first compression structure 510 and the second compression structure 520 are disposed in a detailed structure, the cost consumed to manufacture the semiconductor manufacturing equipment component can be reduced as a whole.

Although the embodiments of the present invention have been described with reference to the above and the accompanying drawings, those of ordinary skill in the art to which the present invention pertains can understand that it may be implemented in other specific forms without changing the technical spirit or essential features. Therefore, it should be understood that the embodiments described above are illustrative and non-limiting in all respects.

REFERENCE NUMERAL

| | |
|---|---|
| 200, 201: mold | 210: outer plate |
| 220: bottom plate | 230: inner plate |
| 300: heterogeneous composite material | 310: first material |
| 320: second material | 400, 700, 800: frame |
| 410: outer plate | 420: bottom plate |
| 430: inner plate | 500, 501, 502, 503: heterogeneous composite material |
| 710, 720, 730: auxiliary frame | |
| 600, 601: semiconductor manufacturing equipment component | |

What is claimed is:

1. A heterogeneous composite material comprising:
a first compression structure formed by compressing a first material; and
a second compression structure formed by compressing a second material different from the first material, and disposed in close contact with the first compression structure,
wherein at least a portion of the first compression structure and at least a portion of the second compression structure are disposed on both sides of a boundary surface that has a predetermined radius with respect to a central axis and exists in a circular shape in a state in contact with each other at the boundary surface,
wherein the boundary surface includes a plurality of detailed boundary surfaces having different radii with respect to the central axis,
wherein a first portion of the first compression structure and a first portion of the second compression structure are disposed on both sides of the first detailed boundary surface in a state in contact with each other at the first detailed boundary surface among the plurality of detailed boundary surfaces, and
wherein a second portion of the first compression structure and a second portion of the second compression structure are disposed on both sides of a second detailed boundary surface in a state in contact with each other at the second detailed boundary surface among the plurality of detailed boundary surfaces.

2. The heterogeneous composite material of claim 1, wherein the boundary surface comprises at least one of a parallel surface parallel to the central axis and an inclined surface formed inclined to the central axis.

3. A heterogeneous composite material comprising:
a first compression structure formed by compressing a first material;
a second compression structure formed by compressing a second material different from the first material, and disposed in close contact with the first compression structure,
wherein at least a portion of the first compression structure and at least a portion of the second compression structure are disposed on both sides of a boundary surface that has a predetermined radius with respect to a central axis and exists in a circular shape in a state in contact with each other at the boundary surface, and
further comprises at least one of,
a mixed layer including a portion of the first compression structure and a portion of the second compression structure; and
a single layer including only a portion of the first compression structure or a portion of the second compression structure.

4. The heterogeneous composite material of claim 1, wherein the first compression structure and the second compression structure have different electrical conductivity.

5. The heterogeneous composite material of claim 1, wherein the first compression structure includes a carbon nanotube-polytetrafluoroethylene (CNT-PTFE),
wherein the second compression structure includes polytetrafluoroethylene (PTFE).

6. A method for manufacturing a heterogeneous composite material comprising:
installing a frame in a first cavity formed in a mold;
injecting a first material into an outer space of the frame of the first cavity;
removing the frame to form a second cavity including a boundary surface in contact with the first material;
injecting a second material different from the first material into the second cavity; and
simultaneously compressing the first material and the second material to generate a heterogeneous composite material,
wherein the boundary surface exists in a circular shape with a predetermined radius with respect to a central axis of the frame,
wherein at least a portion of the first material and at least a portion of the second material are disposed on both sides of the boundary surface in a state in contact with each other at the boundary surface.

7. The method of claim 6, wherein the mold includes an opening corresponding to a plane of one side of the first cavity,
   wherein the first material and the second material are injected through the opening,
   wherein the frame is inserted into the first cavity or discharged from the first cavity through the opening.

8. The method of claim 6, wherein the first material and the second material are injected into the mold in a form of powder.

9. The method of claim 6, wherein at least one of a mixed layer including the first material and the second material, and a single layer including only the first material or the second material is disposed in the mold.

10. The method of claim 6, wherein the first material and the second material are injected in a form of powder.

11. The method of claim 6, wherein the first material and the second material have different electrical conductivity.

12. The method of claim 6, wherein the first material includes carbon nanotube-polytetrafluoroethylene (CNT-PTFE),
   wherein the second material includes polytetrafluoroethylene (PTFE).

13. The method of claim 6, wherein the frame includes a boundary side surface that forms the boundary surface,
   wherein the boundary side surface includes at least one of a parallel surface parallel to a central axis of the frame and an inclined surface formed inclined to a central axis of the frame.

14. The method of claim 6, wherein the frame includes a plurality of auxiliary frames having boundary side surfaces of different radii with respect to the central axis of the frame,
   wherein a first portion of the first material and a first portion of the second material are disposed on both sides based on a first boundary surface formed by a boundary side surface of a first auxiliary frame among the plurality of auxiliary frames,
   wherein a second portion of the first material and a second portion of the second material are disposed on both sides based on a second boundary surface formed by a boundary side surface of a second auxiliary frame among the plurality of auxiliary frames.

15. A method for manufacturing a heterogeneous composite material comprising:
   installing a frame having a shape of a cylinder or a hollow cylinder in a first cavity formed in a mold and having a shape of a cylinder or a hollow cylinder;
   injecting a first material in a form of powder into an outer space of the frame of the first cavity;
   removing the frame to form a second cavity including a boundary surface in contact with the first material;
   injecting a second material in a form of powder different from the first material into the second cavity; and
   simultaneously compressing the first material and the second material to generate a heterogeneous composite material,
   wherein the mold includes an opening corresponding to a plane of one side of the first cavity, the first material and the second material are injected through the opening, and the frame is inserted into the first cavity or discharged from the first cavity through the opening,
   wherein the frame is installed in the first cavity in a state, in which a central axis of a circular or ring-shaped cross-section of the frame coincides with a central axis of a circular or ring-shaped cross-section of the first cavity,
   wherein the boundary surface exists in a circular shape with a predetermined radius with respect to a central axis of a circular or ring-shaped cross section of the frame,
   wherein at least a portion of the first material and at least a portion of the second material are disposed on both sides of the boundary surface in a state in contact with each other at the boundary surface.

16. The method of claim 15, wherein the first material and the second material have different electrical conductivity.

17. The method of claim 15, wherein the first material includes carbon nanotube-polytetrafluoroethylene (CNT-PTFE),
   wherein the second material includes polytetrafluoroethylene (PTFE).

18. The method of claim 15, wherein the frame includes a boundary side surface that forms the boundary surface,
   wherein the boundary side surface includes at least one of a parallel surface parallel to a central axis of the frame and an inclined surface formed inclined to a central axis of the frame.

19. The method of claim 15, wherein the frame includes a plurality of auxiliary frames having boundary side surfaces of different diameters with respect to a central axis of the frame,
   wherein a first portion of the first material and a first portion of the second material are disposed on both sides based on a first boundary surface formed by a boundary side surface of a first auxiliary frame among the plurality of auxiliary frames,
   wherein a second portion of the first material and a second portion of the second material are disposed on both sides based on a second boundary surface formed by a boundary side surface of a second auxiliary frame among the plurality of auxiliary frames.

* * * * *